(12) United States Patent
Bauer et al.

(10) Patent No.: US 6,229,343 B1
(45) Date of Patent: May 8, 2001

(54) INTEGRATED CIRCUIT WITH TWO OPERATING STATES

(75) Inventors: Regine Bauer; Gunnar Krause, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/395,005

(22) Filed: Sep. 13, 1999

(30) Foreign Application Priority Data

Sep. 15, 1998 (DE) .............................. 198 42 208

(51) Int. Cl.[7] .................. H03K 19/20; H03K 19/00; G01R 31/28
(52) U.S. Cl. ..................... 326/104; 326/16; 714/724
(58) Field of Search ................... 326/104, 105, 326/16, 37, 38; 714/724, 725

(56) References Cited

U.S. PATENT DOCUMENTS

| 4,339,710 | 7/1982 | Hapke . |
| 4,357,703 | 11/1982 | Van Brunt . |
| 4,837,765 | 6/1989 | Suzuki . |
| 4,902,917 | * 10/1994 | Simpson ............................. 326/38 |
| 5,212,442 | 5/1993 | O'Toole . |
| 5,353,250 | * 10/1994 | McAdams ....................... 365/189.03 |
| 5,392,297 | 2/1995 | Bell . |

FOREIGN PATENT DOCUMENTS

| 9000825 | 3/1990 | (DE) . |
| 3723121 C2 | 5/1992 | (DE) . |

OTHER PUBLICATIONS

Siemens Data Sheet, "HYB39S64400/800/160AT (L), 64 MBit Synchronous DRAM". Issue Jul. 98. pp. 1, 7–13.

* cited by examiner

Primary Examiner—Michael Tokar
Assistant Examiner—James H. Cho
(74) Attorney, Agent, or Firm—Herbert L. Lerner; Laurence A. Greenberg; Werner H. Stemer

(57) ABSTRACT

A two-operating state integrated circuit includes a functional device that can selectively occupy a first mode or a second mode, e.g., standby mode and active mode. A separate, small-dimensioned contact pad serves for input of a control signal. A control device is provided for receiving the control signal and for switching the functional device between the first and second modes. In the presence of an active control signal, circuitry generates a state combination of several different control signals that cause a switchover from the first mode to the second mode. In the absence of the control signal the circuitry is transparent. The invention provides improved visual inspection without significant additional outlay for test instruments during a test.

7 Claims, 2 Drawing Sheets

INTEGRATED CIRCUIT WITH TWO OPERATING STATES

BACKGROUND OF THE INVENTION

Field of the Invention

The invention lies in the field of circuit technology. The invention concerns an integrated circuit including a functional device that can occupy a first and a second operating state, and a control device for switching between the states.

Clocked operating semiconductor memories, so-called SDPAMs, have a standby mode and an active mode, as described in Siemens Data Sheet "HYB39S64400/800/160AT(L), 64Mbit Synchronous DRAM", Issue 7.98, Pages 7 to 13, in particular Page 8. The chip is in standby mode when the supply voltage is applied. The mode register is configured through input of a sequence of control signals and the active mode is set. The commands "Mode Register Set", "Precharge All", "Auto/Self Refresh", and "Row Activate" must be input in that order. Including the supply voltage, eight terminal pins must be supplied with potential or signals: VDD, VSS, CKE, CS, CLK, RAS, CAS and WE.

During operation in the system, the signals are fed from a microcontroller over the chip housing terminals. In order to test functional features in the active mode during a semiconductor chip test, the test device must be capable of applying the above signals in the required sequence. Particularly, test equipment for visually inspecting a semiconductor slice at the end of manufacture and before being cut into the individual chips, often lacks appropriate devices for feeding such signals. Separately, eight needles must be set on the chip in order to feed in the signals. Chip area is hidden and visual inspection is restricted because semiconductor memory connection areas for input signals are not located near the edge of the chip but in its middle. As a result, manual positioning of the probe needles requires a considerable outlay of work and expense.

SUMMARY OF THE INVENTION

It is accordingly an object of the invention to provide an integrated circuit having a two operating state functional device that overcomes the hereinafore-mentioned disadvantages of the heretofore-known devices of this general type and that can be tested in a simple way.

With the foregoing and other objects in view, there is provided, in accordance with the invention, an integrated circuit, including: a functional device having a first mode of operation preset on start-up and a second mode of operation; a control device for receiving at least two control signals and for switching the functional device between the first mode of operation and the second mode of operation when a defined combination of the at least two control signals is received by the control device; a contact pad for receiving and transmitting a further control signal having a first state; and circuitry connected to the contact pad and to the control device, the circuitry generating and transmitting the defined combination of the at least two control signals to the control device in response to receiving the first state of the further control signal from the contact pad.

The circuitry for generating the control signal combination for the switchover between the operating states is connected such that the control signal is guaranteed to be inactive during normal operation if no control signal is applied to the test contact pad. A suitable way of doing this is to use a pull-up or pull-down resistor, depending on the polarity of an active control signal applied to the test contact pad. It is beneficial if the control signal at the test contact pad is low-active. Thus, a pull-up resistor is provided. In addition, it is also beneficial if a switching transistor that is controlled in opposition to the signal to be applied to the test contact pad is connected in parallel to the pull-up resistor. The signal injected at the test contact pad is combined through logic elements with the control signal combination that serves to switch between the operating states. The logic operation produces the effect that if an active control signal is applied to the test contact pad, that combination of signal states is generated through which a switchover takes place from standby mode into active mode. Otherwise, the logic elements are transparent for the control signals generated by the system controller.

In accordance with another feature of the invention, there is provided a resistor connected between the contact pad and a supply potential terminal, and another supply potential terminal connected to the circuitry, a voltage of the first state of the further control signal being equal to a supply voltage of the another supply potential terminal.

In accordance with a further feature of the invention, there is provided an inverter having an input and an output, and a switching transistor having a control input and a load path, the load path being connected in parallel to the resistor, the control input being connected to the output of the inverter and the input of the inverter being connected to the contact pad.

In accordance with an added feature of the invention, there is provided a second switching transistor having a second control input and a second load path, the second load path being connected in parallel to the resistor and the second control input being controlled by a signal that insures stable application of the integrated circuit supply voltage.

In accordance with an additional feature of the invention, the further control signal has at least one other state different from the first state and the circuitry includes a plurality of logic elements each having a first input connected to an input terminal for each one of the at least two control signals, a second input coupled to the contact pad and an output, wherein, in the first state of the further control signal, the defined combination of the at least two control signals is transmitted on the output to the control device, and, in the at least one other state of the further control signal, signals received at the first input of the logic elements are transmitted on the output to the control device.

In accordance with yet another feature of the invention, the at least two control signals are three control signals and there is provided two AND gates each having a first input, a second input and an output, an OR gate having a first input, a second input and an output and a second inverter having an input and an output, the input of the second inverter being connected to the output of the inverter, the output of the second inverter being connected with the first input of the two AND gates, the first control signal of the three control signals being input to the second input of a first of the two AND gates, the second control signal of the three control signals being input to the second input of a second of the two AND gates such that the output of the first of the two AND gates carries a first of the three control signals and the output of the second of the two AND gates carries a second of the three control signals and the input of the second inverter being connected with the first input of the OR gate, the third control signal of the three control signals being input to the second input of the OR gate such that the output of the OR gate carries the third control signal of the three control signals.

According to the invention, a single signal is transmitted through a contact pad to generate the combination of control signals that cause the switchover from one operating state to the other during normal operation. During testing of the integrated circuit it is necessary to feed only a single control signal and, in addition, the supply voltage. It is useful if the contact pad realized is considerably smaller than a conventional bonding pad provided for a bonding connection to a housing pin.

In accordance with a concomitant feature of the invention, there is provided at least one additional contact pad for connecting at least one of a group consisting of a supply potential and a signal, and the contact pad has an area between 10 and 1000 times smaller than an area of the at least one additional contact pad.

Other features that are considered as characteristic for the invention are set forth in the appended claims.

Although the invention is illustrated and described herein as embodied in an integrated circuit with two operating states, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
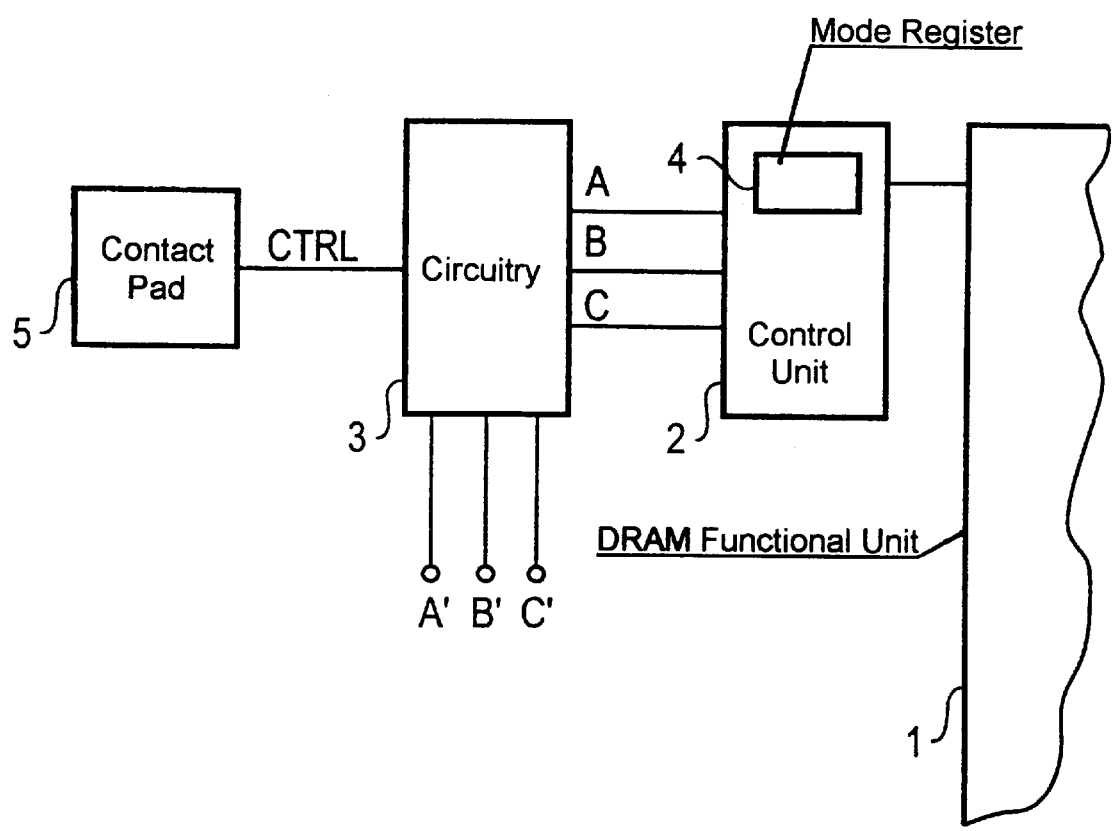
FIG. 1 is a diagrammatic partial view of the circuit of the invention.

Referring now to the figures of the drawings in detail and first, particularly to FIG. 1 thereof, there is seen an integrated semiconductor circuit with parts relevant to the invention, for example an integrated semiconductor memory (DRAM). A functional unit 1 can be operated in a first operating state or in a second operating state. In the DRAM example, the functional unit 1 is the memory cell array including circuit blocks for operating the memory cell array, such as memory cells, read amplifiers, decoders, voltage generators, etc. The DRAM functional unit 1 is in standby mode when the supply voltage is applied, i.e., the voltage generators are essentially used only for charge maintenance for leakage current compensation. In active mode, on the other hand, word lines and bit lines are actively connected. In active mode, internal voltage generators must be driven at full load with correspondingly large power losses. A control unit 2 containing a mode register 4 with states that define the mode setting performs the switchover between standby and active mode. The mode register 4 is configured in the active mode if a defined combination of signal states exists for signals A, P and C, for example, A=L, B=L, C=H. When the semiconductor memory is in normal operation, the control signals A, B, C are derived from control signals A', B', C'. Signals A', B', C' are generated from a higher-level control device that communicates with an external microcontroller. The configuration provides a number of consecutive different signal states for a plurality of signals. The particular signal combination for configuring the mode register 4 is input at the end of the sequence of signals.

Circuitry 3 is provided for controlling the combined action of the control signals A', B', C' and a further external control signal CTRL. If the further control signal CTRL is inactive (e.g. at an H-level), the circuitry 3 is transparent for the signals A', B', C'. In other words, the signal states of signals A', B', C' are passed on to the signals A, B, C without modification. In the control unit 2, the mode register 4 is set such that the memory cell array 1 switches from standby mode to active mode. If the control signal CTRL is activated (e.g. has an L-level), the states of the signals A', B', C' are not passed on to the signals A, B, C. Instead, a combination of signals A, B, C is generated to effect the switchover. Specifically, the combination is A=L, B=L, C=H. Functionality of the circuitry 3 is symbolically represented in the following table.

| CTRL | Input A' | Input B' | Input C' | Output A | Output B | Output C |
|---|---|---|---|---|---|---|
| H | A' | B' | C' | A' | B' | C' |
| L | Irrelevant | Irrelevant | Irrelevant | L | L | H |

Regardless of the existing mode register 4 configuration or of the functional unit 1 operating state, generating an L-level as the further control signal CTRL effects an unconditional switchover into the active mode. Accordingly, external input of a number of signals in a defined sequence is no longer necessary.

The circuit is especially suitable for testing the functional unit 1 in active mode after the supply voltage is applied. For testing purposes it is only necessary (in addition to the supply voltage) to place a test instrument test needle providing the signal CTRL onto a contact pad 5. Conventionally, bonding pads on an integrated semiconductor chip are disposed in the middle of the chip and not at the edge. Nonetheless, bonding pads only cover a relatively small area of the chip surface. Accordingly, visual inspection can take place without significant limitations. Infrared analysis makes it possible to effect a "HOTSPOT" test in the active mode. An analogous situation applies for analytical methods using emission microscopy.

The contact pad 5 is relevant only for the circuit test. In particular, the contact pad 5 is not bonded to a terminal pin of the housing. In contrast, the bonding pads for connection to a supply voltage, a signal input and a signal output are bonded to a terminal pin of the housing. Therefore, the contact pad 5 can be made much smaller than the bonding pads. The contact pad 5 is, for example, dimensioned to be 5 $\mu$m×5 $\mu$m. Conventional bonding pads are in the range of 80 $\mu$m×80 $\mu$m to 100 $\mu$m×100 $\mu$m. Therefore, the length of the contact pad 5 side is at least an order of magnitude smaller than a conventional bonding pad side, i.e. the lengths of the sides are in the ratio of 1:10. Accordingly, the comparative area ratio is a hundred times as great for the conventional pad when compared to the contact pad 5.

After the relevant test, it is useful to coat the contact pad 5 with a passivation layer at the very end of the fabrication process because the contact pad 5 is no longer used.

Figure 2:
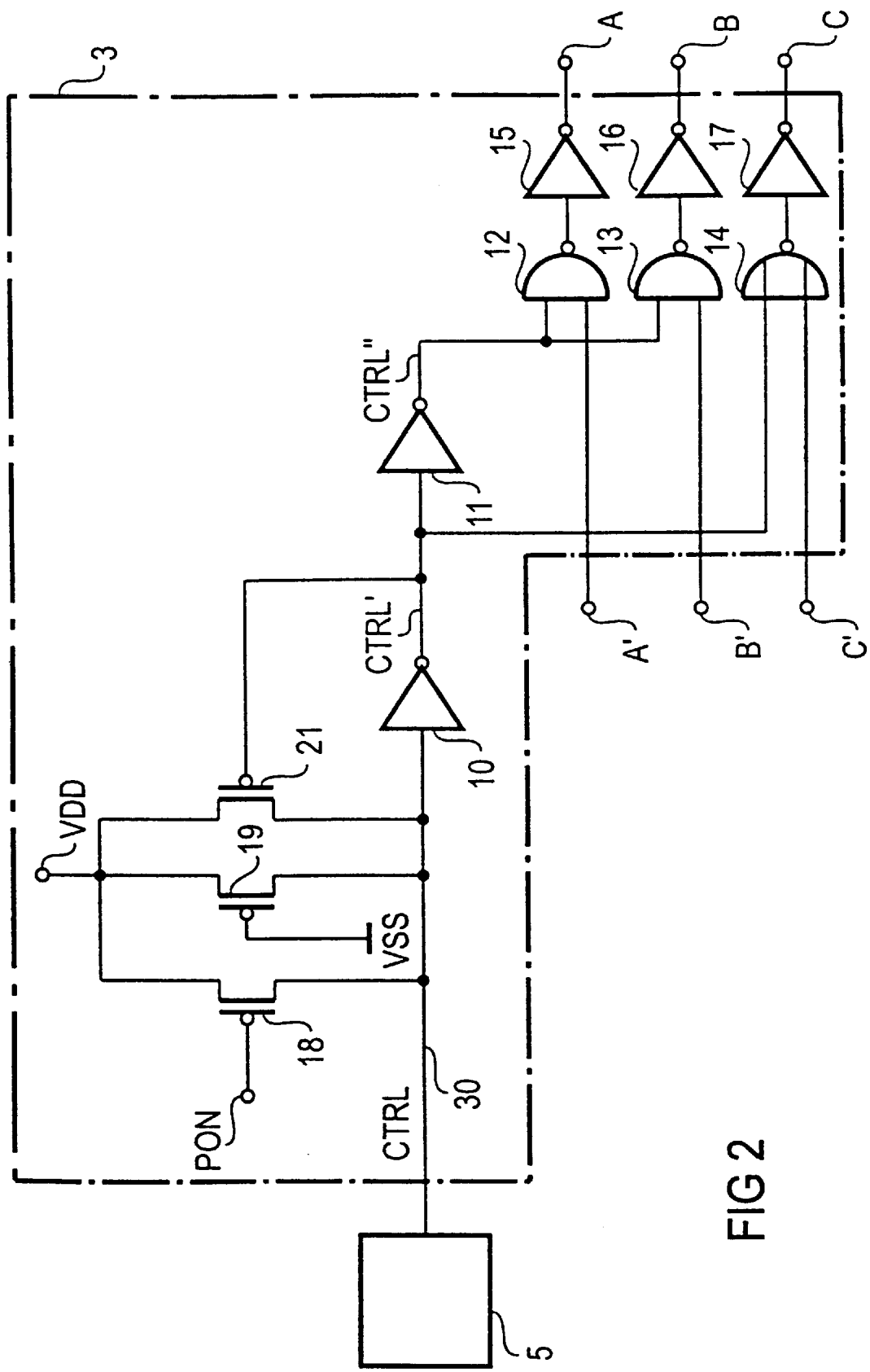
FIG. 2 is a diagrammatic and partial schematic view of a section of the circuit illustrated in FIG. 1.

Details of the circuitry 3 are illustrated in FIG. 2. Corresponding elements within FIGS. 1 and 2 are given the same reference numeral. Line 30 carries the control signal CTRL and is connected to the pad 5 through a pull-up resistor to the terminal for the positive supply potential VDD. The pull-up resistor is formed by one (or more) p-channel MOS transistors 19 with their drain source paths connected in series and their gate terminals connected to the negative supply potential VSS. Collectively, these transistors function as a high-impedance pull-up resistor. The effective channel length of the transistor configuration determines the total impedance. A further p-channel MOS transistor 21 is connected between the line 30 and the terminal for the supply potential VDD, i.e., parallel to the pull-up resistor. The gate terminal of the further p-channel MOS transistor 21 is controlled in opposition to the control signal CTRL. For this purpose the line 30 is connected to an inverter 10. The output side of the inverter 10 is connected to the gate terminal of the transistor 21. The line 30 is connected such that when no signal is injected at the contact pad 5, the line 30 potential is raised, through the pull-up resistor, to the supply potential VDD. The inverter 10 then controls the transistor 21 such that the transistor 21 is switched to become conducting and helps to clamp the line 30 at the potential VDD.

In addition, a p-channel MOS transistor 18 is located parallel to the pull-up resistor. The gate terminal of the p-channel MOS transistor 18 is controlled by a signal PON. The signal PON reports and insures that the supply potential is powered up and is adequately stable. Immediately after the supply voltage is applied, the signal PON lies at an L-level and the transistor 18 is conducting. Thereby, the line 30 is securely shorted to the terminal for the supply potential VDD as soon as possible after application of the supply voltage, even if the inverter 10 does not switch properly due to an inadequate supply voltage and if the pull-up resistor 19 is not yet able to completely charge up the capacitative load of the line 30 to the potential VDD. When the supply voltage is sufficient, the signal PON shifts to an H-level, which switches the transistor 18 off. When the transistor 18 is off, the pull-up resistor, the inverter 10 and the switching transistor 21 are effective.

The signal CTRL' at the output of the inverter 10 is fed to a NOR gate 14. The other input of the NOR gate 14 is connected to the signal C'. An inverter 17 is connected in series with the NOR gate 14 and the control signal C that is injected into the control unit 2 is connected to the output side of this inverter 17.

The elements 14 and 17 perform the logic function of an OR gate. A further inverter 11 is connected in series with the inverter 10. The output side of the further inverter 11 is the signal CTRL", which, in turn, leads to each of the NAND gates 12, 13. The other inputs of the NAND gates 12, 13 are controlled by signals A' and B', respectively. Inverters 15, 16 are connected in series with the NAND gates 12, 13, respectively. The output side of the inverters 15, 16 are the signals A, B. Series connection of the inverters and NAND gates functions as an AND gate.

If the control signal CTRL at the contact pad 5 is activated with an L-level, the transistor 21 is switched off. Although a small current flows through the high-impedance pull-up resistor, an external driver that is a strong current sink provides the L-level of the signal CTRL. Thus, the current sink characteristic of the active signal CTRL dominates over the pull-up current of the resistor. The circuit formed by the elements 11 to 17 functions such that when there is an active (L-level) control signal CTRL, the signals A, B, C are generated at the outputs of the circuit 3 in the combination that causes the control unit 2 to switch over from the standby mode into the active mode (A=L, B=L, C=H). Alternatively, if no signal is actively injected at the contact pad 5, the line 30 carries the positive supply potential VDD. In this state, the circuit part 11 to 17 functions such that the signals A', B', C' are transmitted unchanged to the signals A, B, C at the circuit output. In other words, the circuit 3 is transparent for the signals A', B', C'.

The additional circuit outlay for the invention includes only a few gates and transistors together with a small-dimensioned pad. Therefore, the circuit can be configured on the integrated semiconductor chip on an insignificant area. The circuit of the invention improves error detection on the semiconductor chip during a visual inspection in active mode. Special outlay at the test instrument for the otherwise necessary timed injection of a plurality of signals is no longer necessary. A test of this kind is normally carried out with selected chips on the semiconductor slice during the circuit fabrication but before being separated into the individual chips.

We claim:

1. An integrated circuit, comprising:
    a functional device having a first mode of operation preset on start-up and a second mode of operation;
    a control device for receiving at least two control signals and for switching said functional device between said first mode of operation and said second mode of operation when a defined combination of the at least two control signals is received by said control device;
    a contact pad for receiving and transmitting a further control signal having a first state; and
    circuitry connected to said contact pad and to said control device, said circuitry generating and transmitting the defined combination of the at least two control signals to the control device in response to receiving the first state of the further control signal from said contact pad, the further control signal having at least one other state different from the first state, and said circuitry including a plurality of logic elements each having a first input connected to an input terminal for each one of the at least two control signals, a second input coupled to said contact pad and an output, wherein, in the first state of the further control signal, the defined combination of the at least two control signals is transmitted on said output to said control device, and, in the at least one other state of the further control signal, signals received at said first input of said logic elements are transmitted on said output to said control device.

2. The integrated circuit according to claim 1, further comprising a resistor connected between said contact pad and a supply potential terminal, and another supply potential terminal connected to said circuitry, a voltage of the first state of the further control signal being equal to a supply voltage of said another supply potential terminal.

3. The integrated circuit according to claim 2, further comprising an inverter having an input and an output, and a switching transistor having a control input and a load path, said load path being connected in parallel to said resistor, said control input being connected to said output of said inverter, and said input of said inverter being connected to said contact pad.

4. The integrated circuit according to claim 3, further comprising a second switching transistor having a second control input and a second load path, said second load path being connected in parallel to said resistor and said second control input being controlled by a signal that insures stable application of the integrated circuit supply voltage.

5. The integrated circuit according to claim 3, wherein the at least two control signals are three control signals and including:

two AND gates each having a first input, a second input and an output;

an OR gate having a first input, a second input and an output; and a second inverter having an input and an output, said input of said second inverter being connected to said output of said inverter, said output of said second inverter being connected with said first input of said two AND gates, the first control signal of the three control signals being input to said second input of a first of said two AND gates, the second control signal of the three control signals being input to said second input of a second of said two AND gates such that said output of said first of said two AND gates carries a first of the three control signals and said output of said second of said two AND gates carries a second of the three control signals and said input of said second inverter being connected with said first input of said OR gate, the third control signal of the three control signals being input to said second input of said OR gate such that said output of said OR gate carries the third control signal of the three control signals.

6. The integrated circuit according to claim 2, further comprising a second switching transistor having a second control input and a second load path, said second load path being connected in parallel to said resistor and said second control input being controlled by a signal that insures stable application of the integrated circuit supply voltage.

7. The integrated circuit according to claim 1, further comprising at least one additional contact pad for connecting at least one of a group consisting of a supply potential and a signal, said contact pad having an area between 10 and 1000 times smaller than an area of said at least one additional contact pad.

* * * * *